US010332752B2

(12) United States Patent
Takemoto

(10) Patent No.: US 10,332,752 B2
(45) Date of Patent: Jun. 25, 2019

(54) SUBSTRATE, SEMICONDUCTOR DEVICE, AND MANUFACTURING METHOD OF SUBSTRATE

(71) Applicant: OLYMPUS CORPORATION, Hachioji-shi, Tokyo (JP)

(72) Inventor: Yoshiaki Takemoto, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/815,080

(22) Filed: Nov. 16, 2017

(65) Prior Publication Data

US 2018/0076050 A1 Mar. 15, 2018

Related U.S. Application Data

(63) Continuation of application No. PCT/JP2015/065235, filed on May 27, 2015.

(51) Int. Cl.
*H01L 21/44* (2006.01)
*H01L 21/3205* (2006.01)
(Continued)

(52) U.S. Cl.
CPC ........ *H01L 21/3205* (2013.01); *H01L 21/768* (2013.01); *H01L 23/3157* (2013.01); *H01L 23/522* (2013.01); *H01L 2224/11* (2013.01)

(58) Field of Classification Search
CPC ............. H01L 21/3205; H01L 23/3157; H01L 23/522; H01L 21/768; H01L 2224/11
(Continued)

(56) References Cited

U.S. PATENT DOCUMENTS 7,749,888 B2 * 7/2010 Nishiyama ............ H01L 21/563
438/612
8,294,279 B2 * 10/2012 Chen ..................... H01L 21/563
257/686
(Continued)

FOREIGN PATENT DOCUMENTS

JP 2007-208082 A 8/2007
JP 2009-302511 A 12/2009
(Continued)

OTHER PUBLICATIONS

International Search Report dated Aug. 25, 2015, issued in counterpart International Application No. PCT/JP2015/065235, w/English translation (4 pages).
(Continued)

*Primary Examiner* — Vu A Vu
(74) *Attorney, Agent, or Firm* — Westerman, Hattori, Daniels & Adrian, LLP

(57) ABSTRACT

A substrate includes a support layer, a column-shaped first bump, and a second bump. The support layer has a main surface. The first bump is filled with a first conductive metal and also has a first upper surface and a side surface. The second bump includes a plurality of fine particles formed of a second conductive metal and also has a third portion configured to cover the first upper surface and a fourth portion configured to cover a part of the side surface. The first bump is disposed on the main surface, or the first bump is connected to an electrode disposed on the main surface. The second bump has a convex second upper surface. A height of the fourth portion in a direction perpendicular to the first upper surface is smaller than that of the first bump.

8 Claims, 12 Drawing Sheets

(51) Int. Cl.
    *H01L 23/522*      (2006.01)
    *H01L 21/768*      (2006.01)
    *H01L 23/31*        (2006.01)

(58) Field of Classification Search
    USPC .......................................................... 438/613
    See application file for complete search history.

(56) References Cited

U.S. PATENT DOCUMENTS 8,581,403 B2 * 11/2013 Ouchi ............... H01L 23/49811
                                                                                                                                                                   257/738
2010/0163293 A1     7/2010 Kawai et al.

FOREIGN PATENT DOCUMENTS

| JP | 2010-157718 A | 7/2010 |
| JP | 2011-9376 A | 1/2011 |
| JP | 2014-154749 A | 8/2014 |
| JP | 2014-220653 A | 11/2014 |

OTHER PUBLICATIONS

Office Action dated Oct. 30, 2018, issued in counterpart Japanese application No. 2017-520156, with English translation. (8 pages).

* cited by examiner

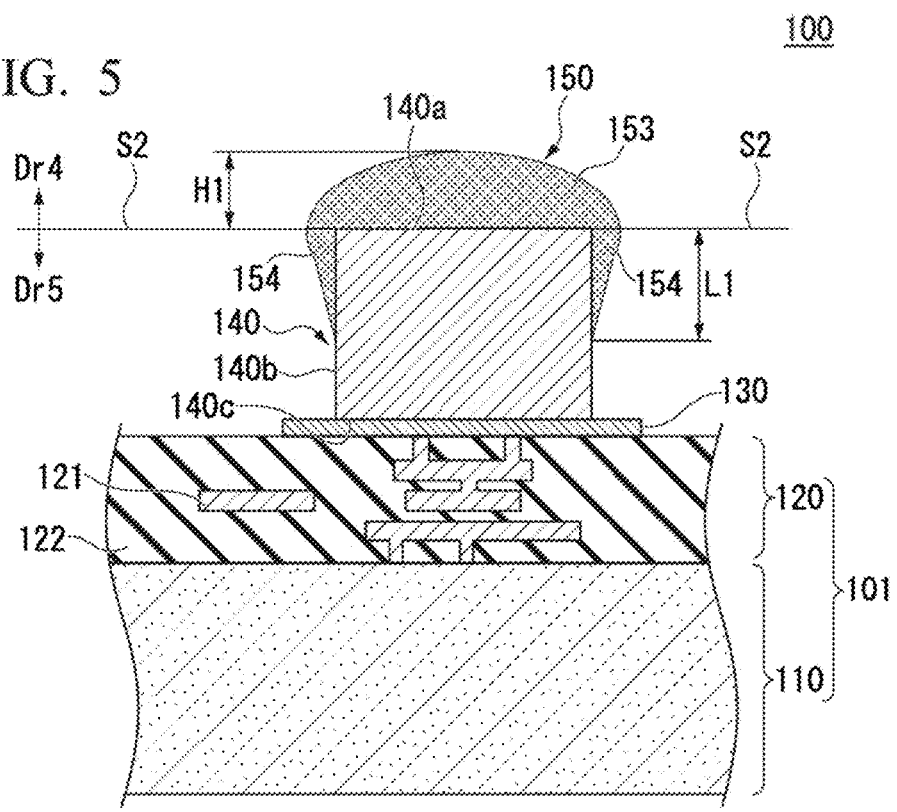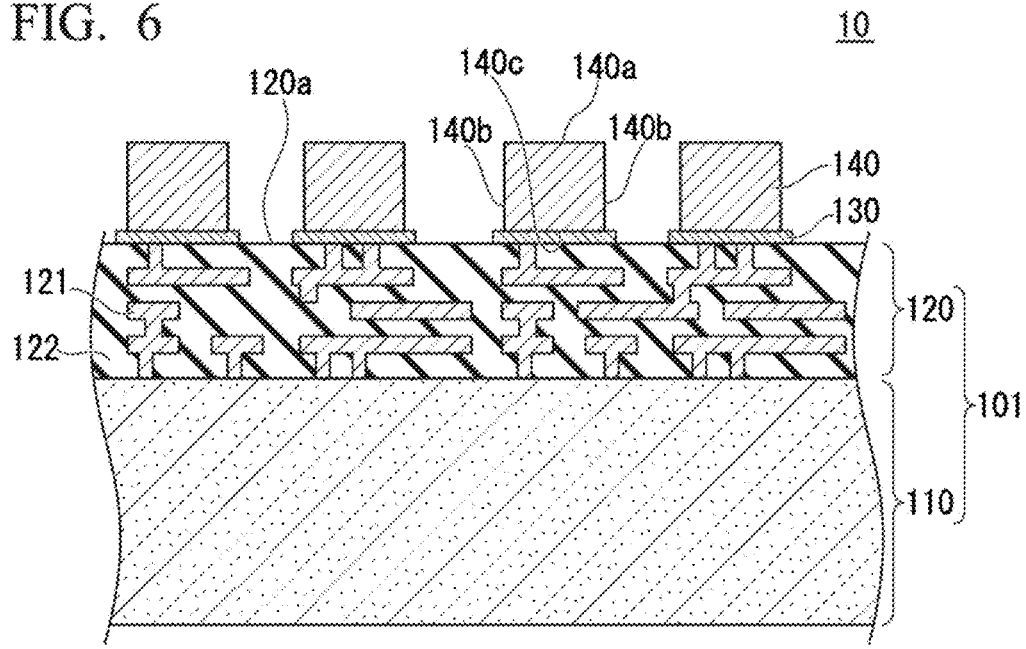

SUBSTRATE, SEMICONDUCTOR DEVICE, AND MANUFACTURING METHOD OF SUBSTRATE

The present application is a continuation application based on International Patent Application No. PCT/JP2015/065235 filed May 27, 2015, the content of which is incorporated herein by reference.

BACKGROUND OF THE INVENTION

Field of the Invention

The present invention relates to a substrate, a semiconductor device, and a manufacturing method of the substrate.

Description of Related Art

In semiconductor devices, performance improvement has been realized by improving a two-dimensional integration rate. However, limits on both miniaturization technology and performance improvement by miniaturization are recognized. For this reason, three-dimensional integration has been provided as one means for improving the performance. Structures such as chip-on-hoard (COB), chip-on-chip (COC), chip-to-wafer (C2W), wafer-to-wafer (W2W) and so on have been studied as such means. In the chip-on-board, a semiconductor chip is directly mounted on a wiring substrate. In the chip-on-chip, a plurality of semiconductor chips are stacked.

As a mounting method, a flip chip method, a wafer bonding method, or the like is used. A method of connecting a plurality of substrates in a vertical direction using a bump electrode, a through silicon via (TSV) and so on is generally used. For example, attempts have been made to realize semiconductor devices with higher performance by stacking a plurality of semiconductor substrates while forming connection electrodes at high density. In view of the above circumstances, a device (semiconductor memory, semiconductor imaging device, and so on) with a stacked structure having a plurality of semiconductor layers has been developed.

Measures against variation in heights of the bump electrodes have been studied in the above-described technique for connecting the plurality of substrates. For example, there is a method of pressing the bump electrodes by applying pressure during mounting. However, distortion remains inside the bump electrodes due to excessive pressing. This may cause a malfunction. Therefore, there is a method of reducing a necessary pressure by flattening a surface of the bump electrodes using a planarization technique.

In Japanese Unexamined Patent Application, First Publication No. 2009-302511, a technique is disclosed for reducing the variation in the heights of the bumps formed on a substrate. In this technique, a first bump layer filled with a metal material is formed on a substrate. A second bump layer formed of a sintered body of metal powder is formed on the first bump layer.

SUMMARY OF THE INVENTION

According to a first aspect of the present invention, a substrate includes a support layer, a column-shaped first bump, and a second bump. The support layer has a main surface. The first bump is filled with a first conductive metal and also has a first upper surface and a side surface. The second bump includes a plurality of fine particles formed of a second conductive metal and also has a third portion configured to cover the first upper surface and a fourth portion configured to cover a part of the side surface. The first bump is disposed on the main surface, or the first bump is connected to an electrode disposed on the main surface. The second bump has a convex second upper surface. A height of the fourth portion in a direction perpendicular to the first upper surface is smaller than that of the first bump.

According to a second aspect of the present invention, in the first aspect, the second bump may have a first portion and a second portion. The first portion may be located on a first direction side with respect to the side surface and a first surface. The second portion may be located on a second direction side with respect to the first surface. The first surface may be a surface which is perpendicular to the first upper surface and is also connected to the side surface. The first direction may be a direction which is perpendicular to the side surface and is also away from the first bump. The second direction may be a direction which is opposite to the first direction. A first thickness of the first portion may be smaller than a second thickness of the second portion.

According to a third aspect of the present invention, in the second aspect, a value obtained by dividing the first thickness by the second thickness may be 0.01 or more and 0.5 or less.

According to a fourth aspect of the present invention, in the first aspect, the third portion may be located on a third direction side of the second surface. The fourth portion may be located on a fourth direction side of the second surface. The second surface may be a plane which is in parallel with the first upper surface and is also in contact with the first upper surface. The third direction may be a direction which is directed from the support layer toward the first upper surface. The fourth direction may be a direction which is opposite to the third direction. A height of the third portion may be less than or equal to a length of the fourth portion in the third direction on the side surface.

According to a fifth aspect of the present invention, in the fourth aspect, a value obtained by dividing the height of the third portion by the length may be 0.01 or more and 0.5 or less.

According to a sixth aspect of the present invention, in the first aspect, an average particle diameter of the plurality of fine particles may be 0.01 µm or more and 1 µm or less.

According to a seventh aspect of the present invention, in the first aspect, the support layer may have a semiconductor layer and a wiring layer stacked on the semiconductor layer. The semiconductor layer or the wiring layer may have the main surface.

According to an eighth aspect of the present invention, a semiconductor device has a plurality of substrates. At least one of the plurality of substrates includes a support layer, a column-shaped first bump, and a second bump. The support layer has a main surface. The first bump is filled with a first conductive metal and also has a first upper surface and a side surface. The second bump is art aggregation of fine particles formed of a second conductive metal and also has a third portion configured to cover the first upper surface and a fourth portion configured to cover a part of the side surface. The first bump is disposed on the main surface, or the first bump is connected to an electrode disposed on the main surface. The second bump has a convex second upper surface. A height of the fourth portion in a direction perpendicular to the first upper surface is smaller than that of the first bump. The support layer has a semiconductor layer and a wiring layer stacked on the semiconductor layer. The semiconductor layer or the wiring layer has the main surface.

According to a ninth aspect of the present invention, a method of manufacturing a substrate includes a first process, a second process, a third process, a fourth process, a fifth process and a sixth process. The first process is a process in which a first substrate is prepared. The first substrate includes a support layer and a column-shaped first bump. The support layer has a first main surface. The first bump is filled with a first conductive metal and also has a first upper surface and a side surface. The first bump is disposed on the first main surface, or the first bump is connected to an electrode disposed on the first main surface. The second process is a process in which a second substrate having a second main surface is prepared. The third process is a process in which a film including fine particles formed of a second conductive metal and an organic solvent is formed on the second main surface. The fourth process is a process in which the first bump is brought into contact with the film in a state in which the first main surface faces the second main surface. The fifth process is a process in which a second bump is formed by separating the first bump from the film after the fourth process. The second bump includes the plurality of fine particles formed of the second conductive metal and the organic solvent and has a third portion configured to cover the first upper surface and a fourth portion configured to cover a part of the side surface. The sixth process is a process in which the organic solvent is removed from the second bump. The second bump has a convex second upper surface. A height of the fourth portion in a direction perpendicular to the first upper surface is smaller than that of the first bump.

BRIEF DESCRIPTION OF THE DRAWINGS

FIG. 5 is a cross-sectional view of the substrate of the first embodiment of the present invention.

FIG. 6 is a view showing a method of manufacturing the substrate according to the first embodiment of the present invention.

DETAILED DESCRIPTION OF THE INVENTION

Embodiments of the present invention will be described with reference to the drawings.

(First Embodiment)

Figure 1:
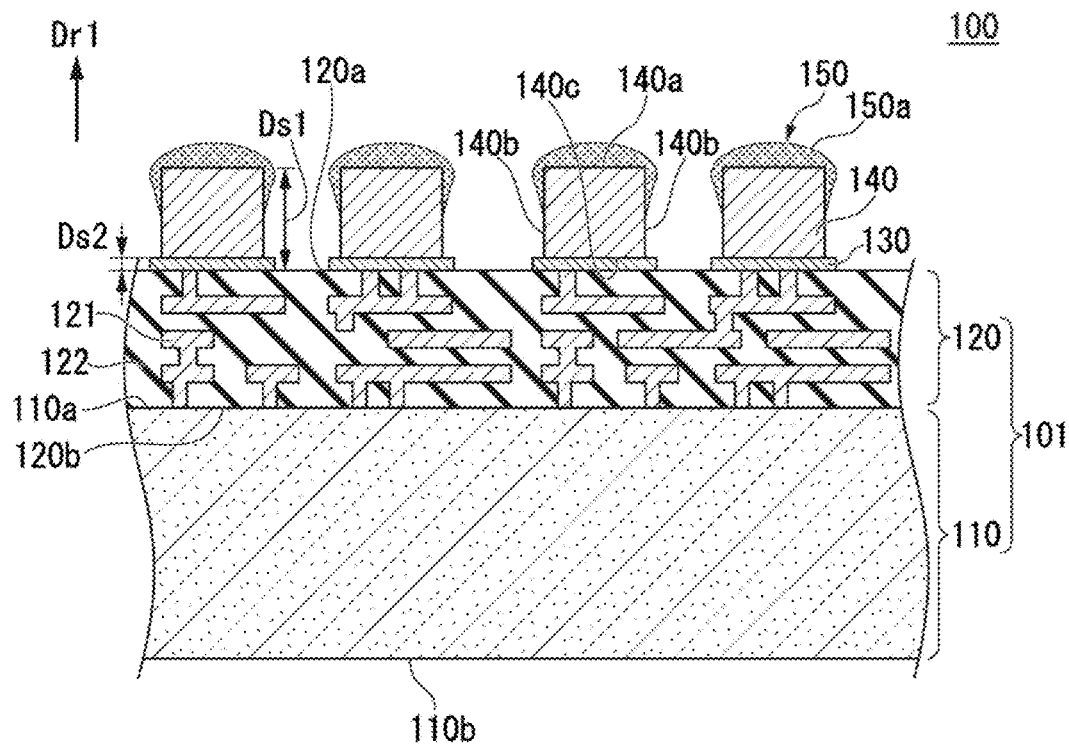
FIG. 1 is a cross-sectional view of a substrate of a first embodiment of the present invention.

FIG. 1 shows a constitution of a substrate 100 of a first embodiment of the present invention. FIG. 1 shows a cross section of the substrate 100. As shown FIG. 1, the substrate 100 includes a support layer 101, an electrode 130, a first bump 140, and a second bump 150. Although a plurality of electrodes 130 are present in FIG. 1, a reference numeral of one electrode 130 is shown as a representative. Although a plurality of first bumps 140 are present in FIG. 1, a reference numeral of one first bump 140 is shown as a representative. Although a plurality of second bumps 150 are present in FIG. 1, a reference numeral of one second bump 150 is shown as a representative.

Dimensions of the parts constituting the substrate 100 are not in accordance with dimensions shown in FIG. 1. The dimensions of the parts constituting the substrate 100 may be arbitrary. This is also applied to dimensions in cross-sectional views other than FIG. 1.

The support layer 101 includes a semiconductor layer 110 and a wiring layer 120. The semiconductor layer 110 and the wiring layer 120 are stacked in a thickness direction Dr1 of the semiconductor layer 110 and the wiring layer 120. The thickness direction Dr1 is a direction perpendicular to a first surface 120*a*. The semiconductor layer 110 and the wiring layer 120 are in contact with each other. The support layer 101 supports the electrode 130, the first bump 140 and the second bump 150.

The semiconductor layer 110 is formed of a semiconductor material. For example, the semiconductor material is at least one of silicon (Si), germanium (Ge), allium (Ga), arsenic (As), and boron (B). The semiconductor layer 110 has a first surface 110*a* and a second surface 110*b*. The first surface 110*a* is in contact with the wiring layer 120. The second surface 110*b* constitutes one of main surfaces of the support layer 101. The main surface of the support layer 101 is the widest surface among a plurality of surfaces constituting surfaces of the support layer 101.

The wiring layer 120 includes a wiring 121 and an interlayer insulation film 122. Although a plurality of wirings 121 are present in FIG. 1, a reference numeral of one wiring 121 is shown as a representative.

The wiring 121 is formed of a conductive material. For example, the conductive material constituting the wiring 121 is a metal such as aluminum (Al) or copper (Cu). The wiring layer 120 has a first surface 120*a* and a second surface 120*b*. The first surface 120*a* is in contact with the plurality of electrodes 130. The first surface 120*a* constitutes one of the main surfaces of the support layer 101. The second surface 120*b* is in contact with the first surface 110*a*.

The wiring 121 is a thin film on which a wiring pattern is formed. The wiring 121 transmits a signal. The wiring 121 of only one layer may be formed, or the wiring 121 of plural layers may be formed. In an example shown in FIG. 1 a three-layer wiring 121 is formed. A multilayer wiring 121 is connected by vias.

In the wiring layer 120, a portion other than the wiring 121 is constituted by the interlayer insulation film 122. The interlayer insulation film 122 is formed of an insulating material. For example, the insulating material is at least one of silicon dioxide ($SiO_2$), an oxide of silicon carbide (SiCO), silicon nitride (SiN), and so on.

At least one of the semiconductor layer 110 and the wiring layer 120 may include a circuit element such as a transistor.

As described above, the support layer 101 includes the semiconductor layer 110 and the wiring layer 120 stacked on the semiconductor layer 110. The semiconductor layer 110 or the wiring layer 120 has a main surface on which the plurality of electrodes 130 or the plurality of first bumps 140 are disposed. In FIG. 1, the main surface of the support layer 101 is the first surface 120a. The support layer 101 may be a printed wiring substrate or an interposer substrate.

The plurality of electrodes 130 are disposed on the first surface 120a. The electrode 130 is formed of a conductive material. For example, the conductive material constituting the electrode 130 is at least one of gold (Au), copper (Cu), nickel (Ni), and so on. Since the electrode 130 is disposed, the first bump 140 is easily formed. The electrode 130 is connected to the via of the wiring layer 120. Accordingly, the electrode 130 is electrically connected to the wiring 121 through the via of the wiring layer 120.

The plurality of first bumps 140 are disposed on the plurality of electrodes 130. The plurality of first bumps 140 are in contact with the plurality of electrodes 130. That is, the plurality of first bumps 140 are connected to the plurality of electrodes 130. The first bump 140 is filled with a first conductive metal. In the first bump 140, atoms of the first conductive metal constituting the first bump 140 are arranged regularly. For example, the first conductive metal is at least one of gold (Au), copper (Cu), nickel (Ni), and so on. For example, the electrode 130 and the first bump 140 are formed of the same material. For example, the first bump 140 is formed by a plating method. The first bump 140 may be formed by a vapor deposition method or a sputtering method.

The first bump 140 has a first upper surface 140a a side surface 140b, and a bottom surface 140c. The first bump 140 has a column shape. The bottom surface 140c is in contact with the electrode 130. The first upper surface 140a and the bottom surface 140c are surfaces at different positions in the thickness direction Dr1. A distance Ds1 between the first upper surface 140a and the support layer 101 (the first surface 120a) is larger than a distance Ds2 between the bottom surface 140c and the support layer 101 (the first surface 120a). For example, the first upper surface 140a and the bottom surface 140c are in parallel with the first surface 120a. The side surface 140b connects the first upper surface 140a and the bottom surface 140c. For example, the side surface 140b is perpendicular to the first surface 120a. That is, a cross-sectional area of the first bump 140 in parallel with the first upper surface 140a is constant regardless of a distance from the first upper surface 140a in the thickness direction Dr1. The cross-sectional area of the first bump 140 may be gradually increased according to the distance from the first upper surface 140a in the thickness direction Dr1. That is, the side surface 140b may be inclined with respect to the first surface 120a.

The plurality of second bumps 150 are disposed on the first upper surface 140a and the side surface 140b. The plurality of second bumps 150 are in contact with the first upper surface 140a and the side surface 140b. That is, the plurality of second bumps 150 are connected to the plurality of first bumps 140. The second bump 150 includes a plurality of fine particles formed of a second conductive metal. That is, the second bump 150 is an aggregation of the plurality of fine particles formed of the second conductive metal. For example, the second conductive metal is at least one of gold (Au), silver (Ag), copper (Cu), and so on. The second bump 150 covers the whole of the first upper surface 140a and a part of the side surface 140b. The second bump 150 has a convex second upper surface 150a. The second bump 150 gradually becomes thinner according to the distance from the first upper surface 140a in the thickness direction Dr1. That is, a cross-sectional area of the second bump 150 in parallel with the first upper surface 140a is gradually reduced according to the distance from the first upper surface 140a in the thickness direction Dr1.

The plurality of fine particles constituting the second bump 150 are drawn together by van der Waals force. Therefore, a structure of the second bump 150 is stable. The second bump 150 is cured (sintered) by applying heat and pressure to the second bump 150 at the time of bonding a plurality of substrates. As a result, the plurality of fine particles are bonded. A surface of each of the plurality of fine particles may be covered with a protective film formed of an organic material. In the case in which the surface of each of the plurality of fine particles is covered with the protective film, the protective film is removed when the second bump 150 is cured (sintered).

The semiconductor layer 110 may be disposed at a position of the wiring layer 120, and the wiring layer 120 may also be disposed at a position of the semiconductor layer 110. That is, the semiconductor laser 110 may have a main surface on which the plurality of electrodes 130 are disposed. In this case, for example, through-vias are disposed in the semiconductor layer 110, and the electrode 130 is connected to the wiring layer 120 through the through-vias.

Figure 2:
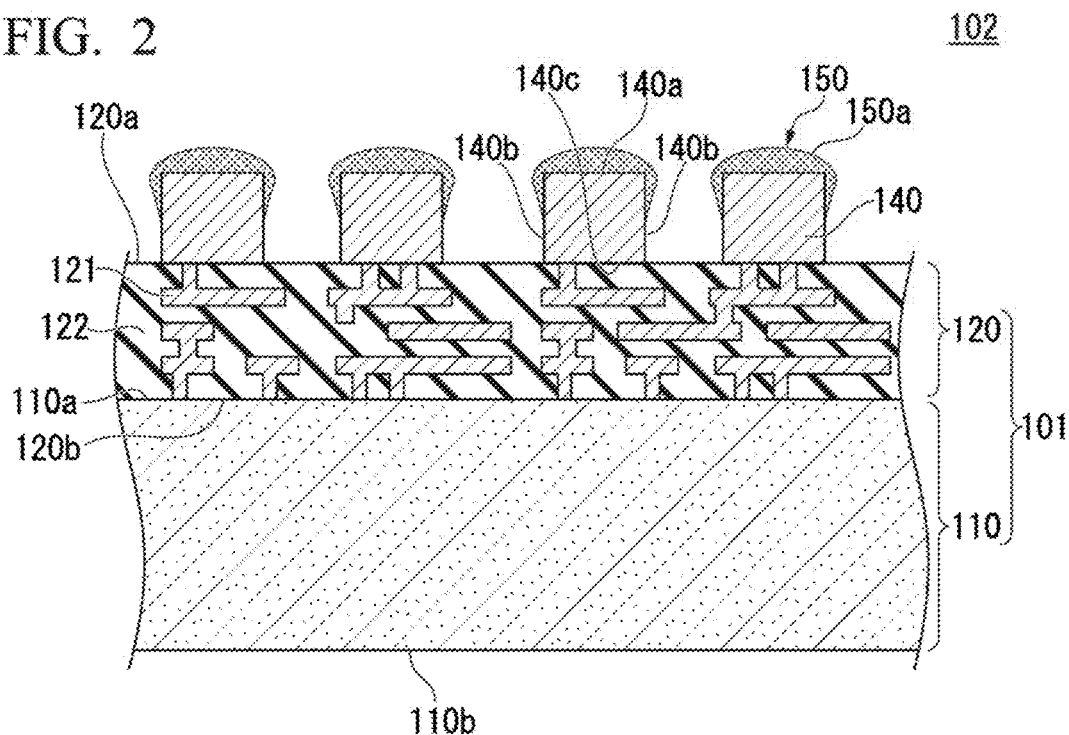
FIG. 2 is a cross-sectional view of the substrate of the first embodiment of the present invention.

The substrate of each embodiment of the present invention may be a substrate 102 shown in FIG. 2. FIG. 2 shows a constitution of the substrate 102. In FIG. 2, a cross section of the substrate 102 is shown. As shown in FIG. 2, the substrate 102 includes a support layer 101, a first bump 140, and a second bump 150.

The constitution shown in FIG. 2 will be described with respect to points different from the constitution shown in FIG. 1. The substrate 102 does not have the electrode 130. The plurality of first bumps 140 are disposed on the first surface 120a. The plurality of first bumps 140 are in contact with the first surface 120a. Regarding other points, the constitution shown in FIG. 2 is the same as the constitution shown in FIG. 1.

As described above, each of the substrate 100 and the substrate 102 includes the support layer 101, the column-shaped first bump 140, and the second bump 150. The support layer 101 has a first surface 120a (main surface). The first bump 140 is filled with a first conductive metal and also has a first upper surface 140a and a side surface 140b. The second bump 150 includes a plurality of fine particles formed of the second conductive metal and covers the first upper surface 1140a and a part of the side surface 140b. The first bump 140 is disposed on the first surface 120a. Alternatively, the first bump 140 is connected to the electrode 130 disposed on the first surface 120a. The second bump 150 has a convex second upper surface 150a.

The second bump 150 includes the plurality of fine particles formed of the second conductive metal and also has the convex second upper surface 150a. Therefore, the second bump 150 has higher flexibility than a bump having a structure filled with a metal. The second bump 150 is gradually deformed according to pressure by a load when the plurality of substrates are bonded. As a result, the pressure required for bonding is reduced.

An average particle diameter of the plurality of fine particles constituting the second bump 150 is 0.01 μm or more and 1 μm or less. As the plurality of fine particles become smaller, the flexibility of the second bump 150 is enhanced. Therefore, fine particles having an average particle diameter of 1 μm or less are used. In addition, fine particles having an average particle diameter of 0.01 μm or more are used in consideration of a size in which the plurality of fine particles are capable of being produced.

Figure 3:
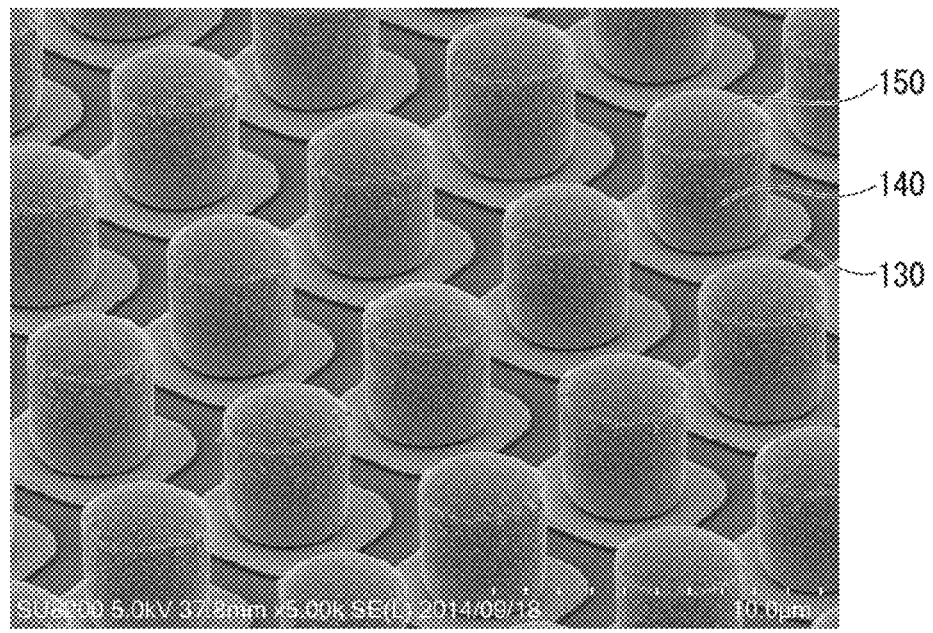
FIG. 3 is a photograph of the substrate according to the first embodiment of the present invention.

FIG. 3 is a photograph of the substrate 100. As shown in FIG. 3, a plurality of electrodes 130, a plurality of first bumps 140, and a plurality of second bumps 150 are arranged in a matrix. In FIG. 3, reference numerals of one electrode 130, one first bump 140 and one second bump 150 are shown as representatives. A cross section of the first bump 140 in parallel with the first surface 120a is a circle. The cross section of the first bump 140 may have a polygonal shape.

Figure 4:
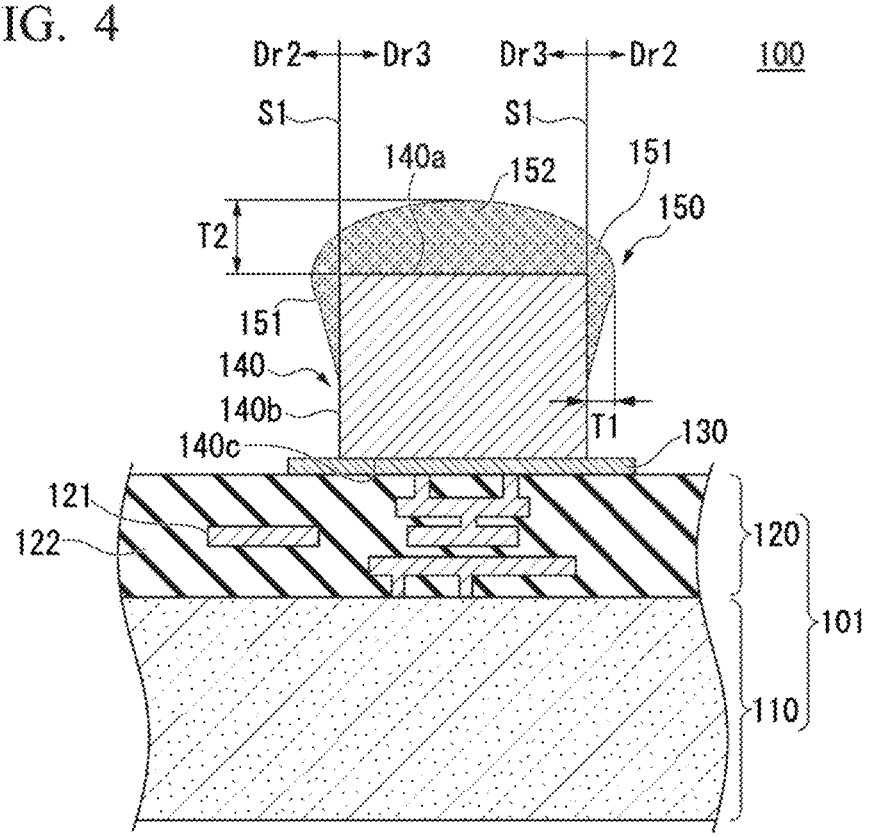
FIG. 4 is a cross-sectional view of the substrate of the first embodiment of the present invention.

FIGS. 4 and 5 are enlarged views of the substrate 100. In FIGS. 4 and 5, a cross section of the substrate 100 is shown. In FIGS. 4 and 5, only a part of the substrate 100 shown in FIG. 1 is shown.

As shown in FIG. 4, the second bump 150 has a first portion 151 and a second portion 152. The first portion 151 is located on a first direction Dr2 side with respect to the side surface 140b and a first surface S1. The second portion 152 is located on a second direction Dr3 side with respect to the first surface S1. The first surface S1 is a surface which is perpendicular to the first upper surface 140a and connected to the side surface 140b. The first surface S1 is connected to the side surface 140b at a portion in which the first upper surface 140a and the side surface 140b are connected. In FIG. 4, a cross section of the first surface S1 is shown by a straight line. For example, when the cross section of the first bump 140 is a circle, the first surface S1 is a cylindrical surface. The first direction Dr2 is a direction which is perpendicular to the side surface 140b and is away from the first bump 140. That is, the first direction Dr2 is a direction toward an outside of the first bump 140. The second direction Dr3 is a direction which is opposite to the first direction Dr2. That is, the second direction Dr3 is a direction toward an inside of the first bump 140. A first thickness T1 of the first portion 151 is smaller than a second thickness T2 of the second portion 152. The first thickness T1 is a thickness in a direction perpendicular to the side surface 140b. The second thickness T2 is a thickness in a direction perpendicular to the first upper surface 4140a. The second portion 152 has a convex shape.

A value obtained by dividing the first thickness T1 by the second thickness T2 may be 0.01 or more and 0.5 or less. That is, the following Equation (1) may be established with respect to the first thickness T1 and the second thickness T2.

$$0.01 \times (T2) < T1 < 0.5 \times (T2) \quad (1)$$

As shown in FIG. 5, the second bump 150 includes a third portion 153 and a fourth portion 154. The third portion 153 is located on a third direction Dr4 side with respect to a second surface S2. The fourth portion 154 is located on a fourth direction Dr5 side with respect to the second surface S2. The second surface S2 is a plane in parallel with the first upper surface 140a and also in contact with the first upper surface 140a. In FIG. 5, a cross section of the second surface S2 is shown by a straight line. The third direction Dr4 is a direction which is directed from the support layer 101 toward the first upper surface 140a. The fourth direction Dr5 is a direction which is opposite to the third direction Dr4. A height H1 of the third portion 153 is less than or equal to a length L1 of the fourth portion 154 of the side surface 140b in the third direction Dr4. The height H1 is a height in a direction perpendicular to the first upper surface 140a. The height H1 is the same as the second thickness T2. The third portion 153 covers the first upper surface 140a. The fourth portion 154 covers a part of the side surface 140b. The height (the length L1) of the fourth portion 154 in a direction Dr5 perpendicular to the first upper surface 140a is smaller the height of the first bump 140. The third portion 153 has a convex shape.

A value obtained by dividing the height H1 by the length L1 may be 0.01 or more and 0.5 or less. That is, the following Equation (2) may be established with respect to the height H1 and the length L1.

$$0.01 \times (L1) < H1 < 0.5 \times (L1) \quad (2)$$

FIGS. 6 to 12 show a method of manufacturing the substrate 100. The method of manufacturing the substrate 100 will be described with reference to FIGS. 6 to 12. In FIGS. 6 and 9 to 12, similarly to FIG. 1, a cross section of each part constituting the substrate 100 is shown. The method for manufacturing the substrate 100 includes a first preparation process (first process), a second preparation process (second process), a film formation process (third process), a transfer process (fourth process), a bump formation process (a fifth process), and a removal process (a sixth process).

(First Preparation Process)

The first preparation process is a process of preparing a substrate 10 (first substrate) shown in FIG. 6. As shown in FIG. 6, the substrate 10 has a support layer 101, an electrode 130, and a column-shaped first bump 140. The support layer 101 has a first surface 120a (first main surface). A structure of the support layer 101 is the same as that of the support layer 101 shown in FIG. 1. The first bump 140 is filled with a first conductive metal. The first bump 140 has a first upper surface 140a, a side surface 140b, and a bottom surface 140c. The first bump 140 is connected to the electrode 130 disposed on the first surface 120a. The first bump 140 may be disposed on the first surface 120a.

The first preparation process may include a process of forming the electrode 130 on the first surface 120a of the support layer 101 and a process of forming the first bump 140 on the electrode 130. The first preparation process may include a process of forming the support layer 101. The process of forming the support layer 101 includes a process of forming the wiring layer 120 on the substrate constituting the semiconductor layer 110. The first preparation process may be performed after the film formation process.

(Second Preparation Process)

Figure 7:
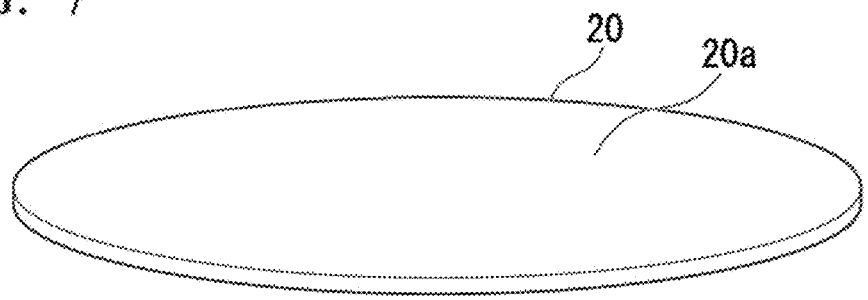
FIG. 7 is a view showing the method of manufacturing the substrate according to the first embodiment of the present invention.

The second preparation process is a process of preparing a substrate 20 (second substrate) shown in FIG. 7. FIG. 7 shows an appearance of the substrate 20. As shown in FIG. 7, the substrate 20 has a surface 20a (second main surface). The surface 20a constitutes one of main surfaces of the substrate 20. The main surface of the substrate 20 is the widest surface among a plurality of surfaces constituting the surface of the substrate 20.

(Film Formation Process)

Figure 8:
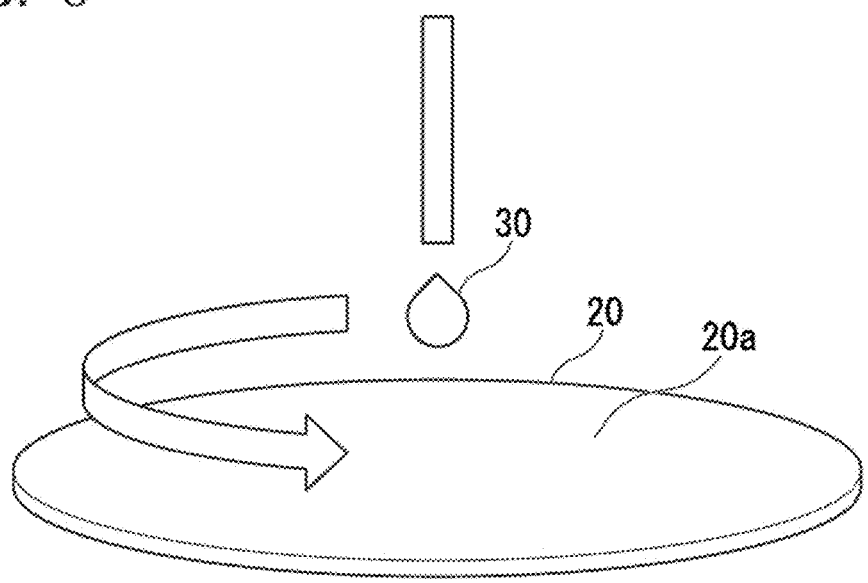
FIG. 8 is a view showing the method of manufacturing the substrate according to the first embodiment of the present invention.
Figure 9:
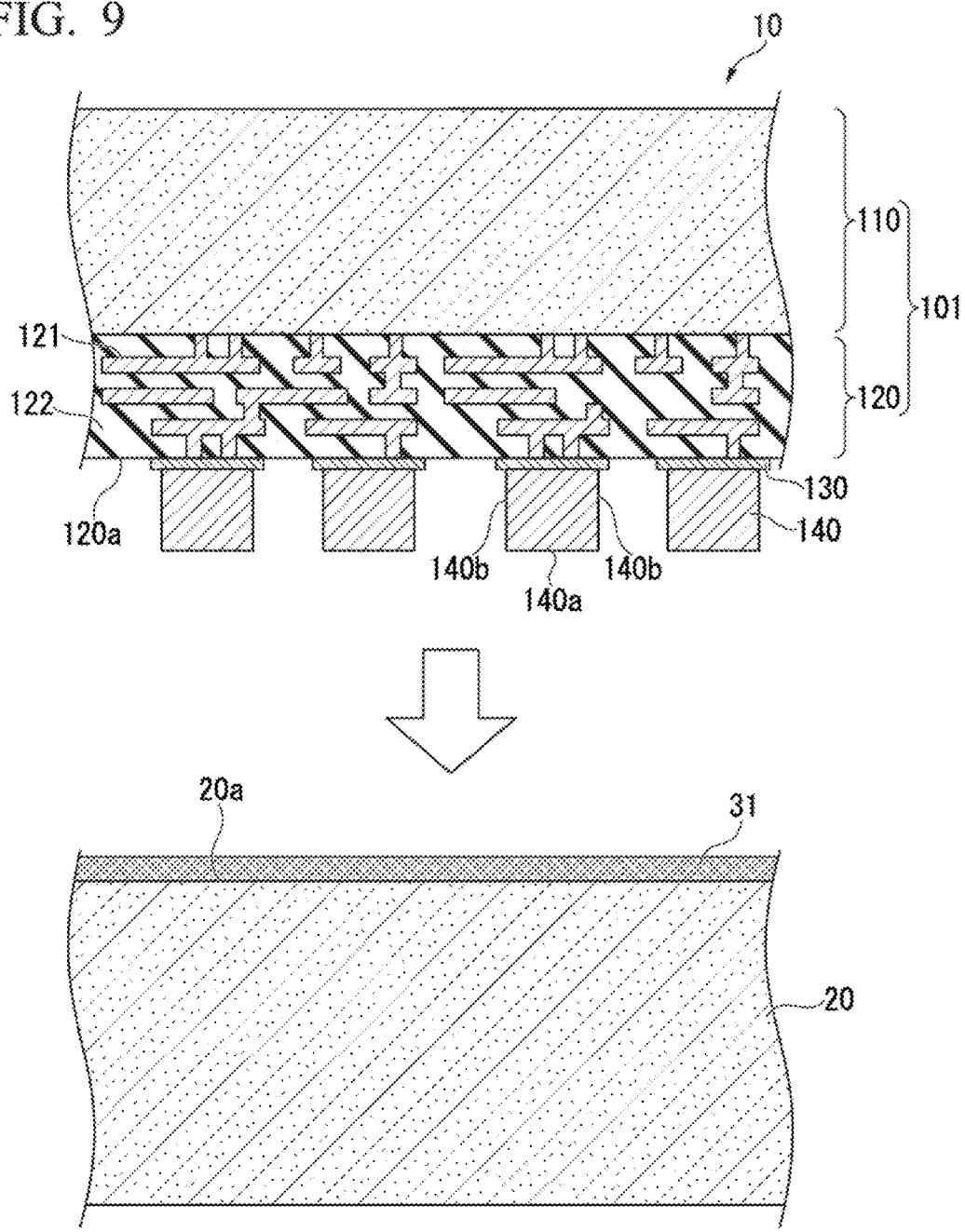
FIG. 9 is a view showing the method of manufacturing the substrate according to the first embodiment of the present invention.

The film forming process is a process of forming a film containing fine particles formed of the second conductive metal and an organic solvent on the surface 20a. As shown in FIG. 8, the surface 20a is coated with an organic solvent 30 containing the fine particles formed of the second conductive metal. The surface 20a is coated with the organic solvent 30 in a state in which the substrate 20 rotates about a rotation axis perpendicular to the surface 20a. Accordingly, a film 31 shown in FIG. 9 is formed on the surface 20a. A thickness of the film 31 depends on a size and a mass ratio of the particles contained in the organic solvent 30 and coating conditions. The surface of the fine particles formed of the second conductive metal is covered with a protective film.

(Transfer Process)

Figure 10:
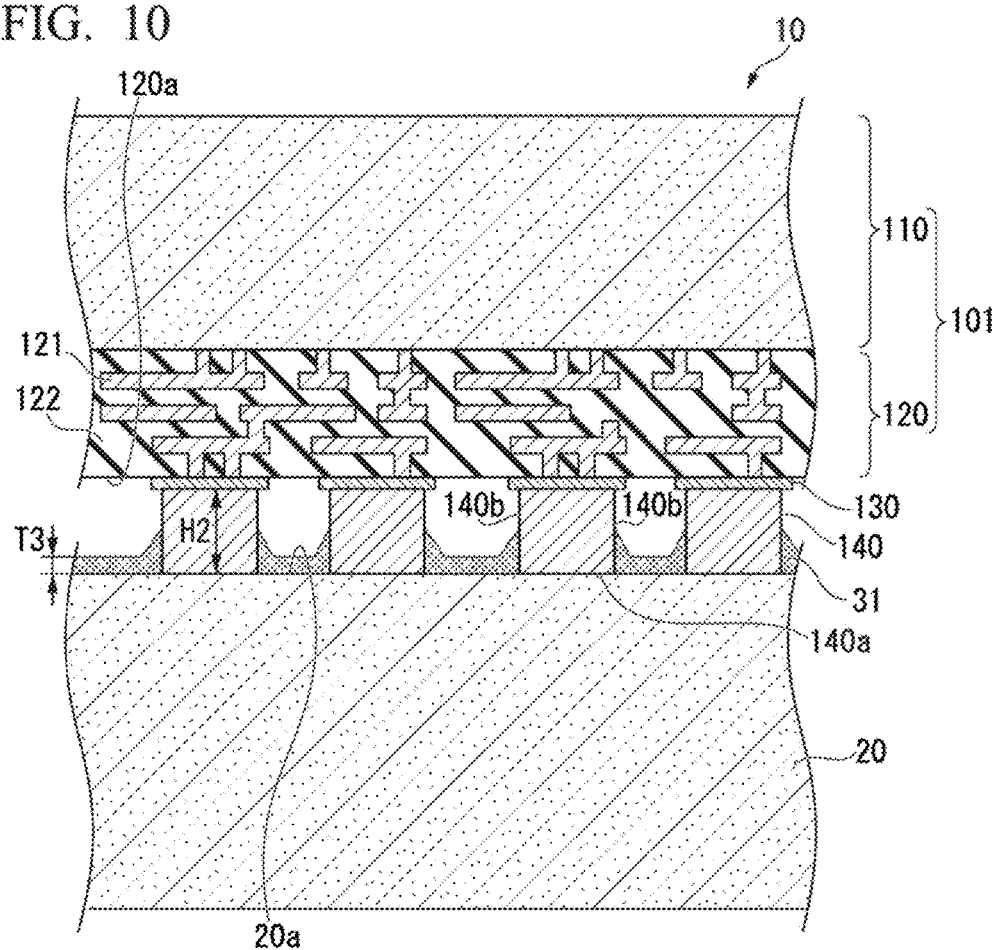
FIG. 10 is a view showing the method of manufacturing the substrate according to the first embodiment of the present invention.

The transfer process is a process of bringing the first bump 140 and the film 31 into contact with each other in a state in which the first surface 120a and the surface 20a face each other. As shown in FIG. 9, the substrate 10 and the substrate 20 are arranged so that the first surface 120a and the surface 20a face each other. After that, at least one of the substrate 10 and the substrate 20 moves so that the first bump 140 comes in contact with the surface 20a. As shown in FIG. 10, the substrate 10 is pressed against the substrate 20. Therefore, the first bump 140 and the film 31 are in contact with each other. As a result, the first upper surface 140a and a part of the side surface 140b are covered with the film 31. A thickness T3 of the film 31 is less than or equal to a height H2 of the first bump 140. The thickness T3 is a thickness in a direction perpendicular to the surface 20a. The height H2 is a height in a direction perpendicular to the first upper surface 140a. For example, the thickness T3 is less than or equal to a half of the height H2.

(Bump Formation Process)

Figure 11:
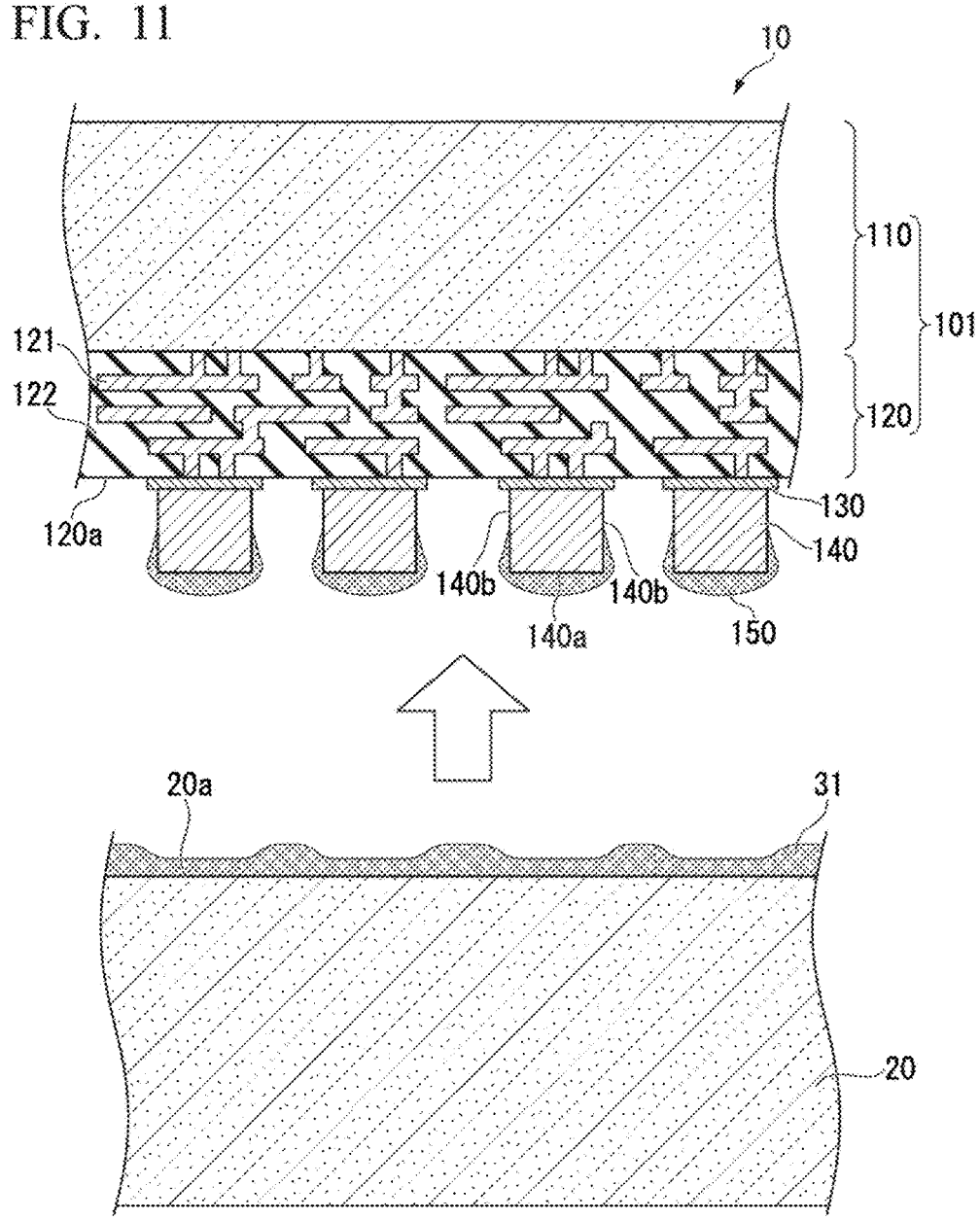
FIG. 11 is a view showing the method of manufacturing the substrate according to the first embodiment of the present invention.

The bump formation process is a process of forming the second bump 150 by separating the first bump 140 from the film 31 after the transfer process. As shown in FIG. 11, at least one of the substrate 10 and the substrate 20 moves so that a distance between the first surface 120a and the surface 20a is increased. Therefore, the first bump 140 is separated from the film 31. A part of the film 31 remains on the first upper surface 140a and the side surface 140b, whereby the second bump 150 is formed. The second bump 150 includes the plurality of fine particles formed of the second conductive metal and the organic solvent and also covers the first upper surface 140a and a part of the side surface 140b.

(Removal Process)

Figure 12:
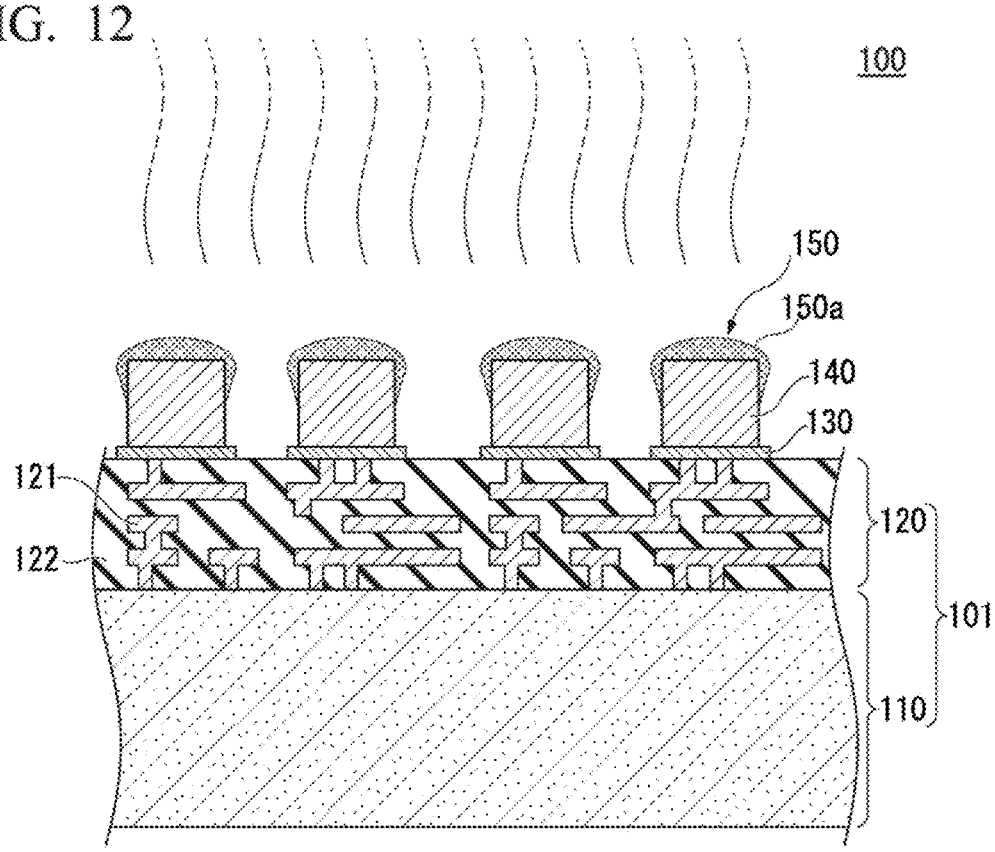
FIG. 12 is a view showing the method of manufacturing the substrate according to the first embodiment of the present invention.

The removal process is a process of removing the organic solvent from the second bump 150. For example, in the removal process, vacuum heating is performed under a condition in which the protective film of the fine particles is not removed and sintering of the fine particles does not occur. Therefore, as shown in FIG. 12, the organic solvent is removed from the second bump 150, and also the substrate 100 is formed. The second bump 150 has a convex second upper surface 150a.

In the first embodiment, the second bump 150 includes the plurality of fine particles formed of the second conductive metal and also has the convex second upper surface 150a. Therefore, the second bump 150 is gradually deformed according to pressure by a load when the plurality of substrates are bonded. As a result, the pressure required for bonding is reduced.

(Second Embodiment)

Figure 13:
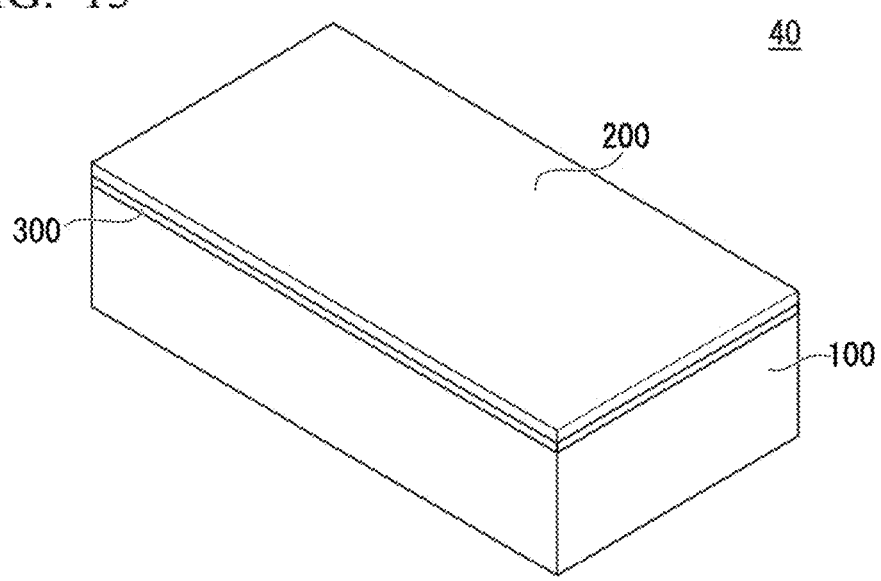
FIG. 13 is a perspective view showing a constitution of a semiconductor device according to a second embodiment of the present invention.

FIG. 13 shows a constitution of a semiconductor device 40 according to a second embodiment of the present invention. As shown in FIG. 13, the semiconductor device 40 includes a substrate 100, a substrate 200, and a connection layer 300. The substrate 100 and the substrate 200 are stacked through the connection layer 300.

Figure 14:
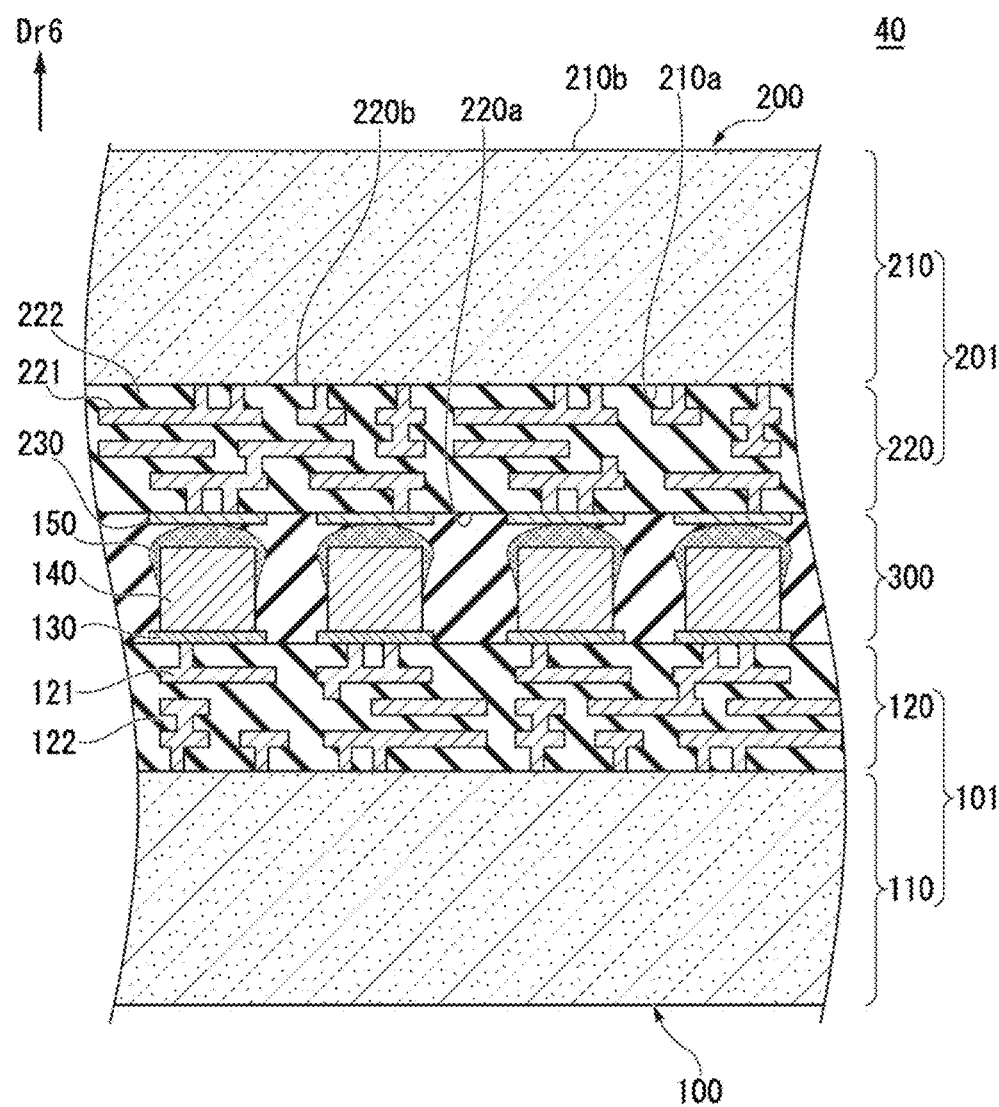
FIG. 14 is a cross-sectional view of the semiconductor device according to the second embodiment of the present invention.

FIG. 14 shows a constitution of the semiconductor device 40. In FIG. 14 a cross section of the semiconductor device 40 is shown.

The substrate 100 shown in FIG. 14 is the same as the substrate 100 shown in FIG. 1. As shown in FIG. 14, the substrate 200 has a support layer 201 and an electrode 230. Although a plurality of electrodes 230 are present in FIG. 14, a reference numeral of one electrode 230 is shown as a representative.

The support layer 201 includes a semiconductor layer 210 and a wiring layer 220. The semiconductor layer 210 and the wiring layer 220 are stacked in a thickness direction Dr6 of the semiconductor layer 210 and the wiring layer 220. The thickness direction Dr6 is a direction perpendicular to a first surface 220a. The semiconductor layer 210 and the siring layer 220 are in contact pith each other. The support layer 201 supports the electrode 230.

The semiconductor layer 210 is formed of a semiconductor material. The semiconductor layer 210 has a first surface 210a and a second surface 210b. The first surface 210a is in contact with the wiring layer 220. The second surface 210b constitutes one of the main surfaces of the support layer 201. The main surface of the support layer 201 is the widest surface among a plurality of surfaces constituting the surface of the support layer 201.

The wiring layer 220 includes a wiring 221 and an interlayer insulation film 222. Although a plurality of wirings 221 are present in FIG. 14, one reference numeral of the wiring 221 is shown as a representative.

The wiring 221 is formed of a conductive material. The wiring layer 220 has the first surface 220a and a second surface 220b. The first surface 220a is in contact with the plurality of electrodes 230. The first surface 220a constitutes one of the main surfaces of the support layer 201. The second surface 220b is in contact with the first surface 210a.

The wiring 221 is a thin film on which a wiring pattern is formed. The wiring 221 transmits a signal. The wiring 221 of only one layer may be formed or the wiring 221 of plural layers may be formed. In an example shown in FIG. 14, a three-layer wiring 221 is formed. A multilayer wiring 221 is connected by vias.

In the wiring layer 220, a portion other than the wiring 221 is constituted by the interlayer insulation film 222. The interlayer insulation film 222 is formed of an insulating material.

At least one of the semiconductor layer 210 and the wiring layer 220 may include a circuit element such as a transistor.

The plurality of electrodes 230 are disposed on the first surface 220a. The electrode 230 is formed of a conductive material. The electrode 230 is connected to the via of the wiring layer 220. Therefore, the electrode 230 is electrically connected to the wiring 221 through the via of the wiring layer 220. The electrode 230 is connected to the second bump 150. Accordingly, the substrate 100 and the substrate 200 are electrically connected to each other. Therefore, the semiconductor device 40 can transmit a signal between the substrate 100 and the substrate 200. The plurality of electrodes 230 may not be provided. That is, the second bump 150 may be in contact with the first surface 220a.

The semiconductor layer 210 may be disposed at a position of the wiring layer 220, and the wiring layer 220 may also be disposed at a position of the semiconductor layer 210. In this case, for example, a through-via is disposed in the semiconductor layer 210, and the electrode 230 is connected to the wiring layer 220 through the through-via. Bumps having the same structures as the first bump 140 and the second bump 150 may be disposed on the electrode 230.

The connection layer 300 is disposed between the wiring layer 120 and the wiring layer 220. The connection layer 300 is formed of a resin. For example, the resin is at least one of epoxy, benzocyclobutene, polyimide, polybenzoxazole and so on. The connection layer 300 may be formed of an insulating material other than the resin. For example, the connection layer 300 may be formed of at least one of silicon dioxide ($SiO_2$), an oxide of silicon carbide (SiCO), silicon nitride (SiN), and so on. The connection layer 300 covers surfaces of the electrode 130, the first bump 140, the second bump 150, and the electrode 230.

As described above, the semiconductor device 40 has a plurality of substrates, that is, the substrate 100 and the substrate 200. A constitution of at least one of the plurality of substrates constituting the semiconductor device 40 has only to be the same as that of the substrate 100. The semiconductor device of each embodiment of the present invention may not have the constitution corresponding to at least one of the electrode 130 and the electrode 230.

In the second embodiment, the semiconductor device 40 includes the first bump 140 and the second bump 150. Therefore, the pressure required for bonding the substrate 100 and the substrate 200 constituting the semiconductor device 40 is reduced.

(Third Embodiment)

Figure 15:
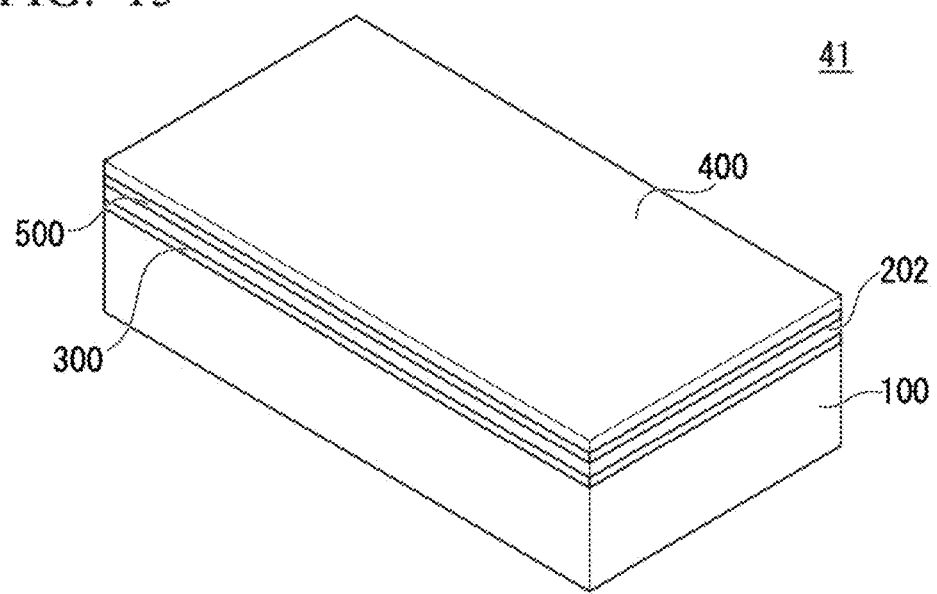
FIG. 15 is a perspective view showing a constitution of a semiconductor device according to a third embodiment of the present invention.

FIG. 15 shows a constitution of a semiconductor device 41 according to a third embodiment of the present invention. As shown in FIG. 15, the semiconductor device 41 includes a substrate 100, a substrate 202, a connection layer 300, a substrate 400, and a connection layer 500. The substrate 100 and the substrate 202 are stacked with the connection layer 300 interposed therebetween. The substrate 202 and the substrate 400 are stacked through the connection layer 500.

Figure 16:
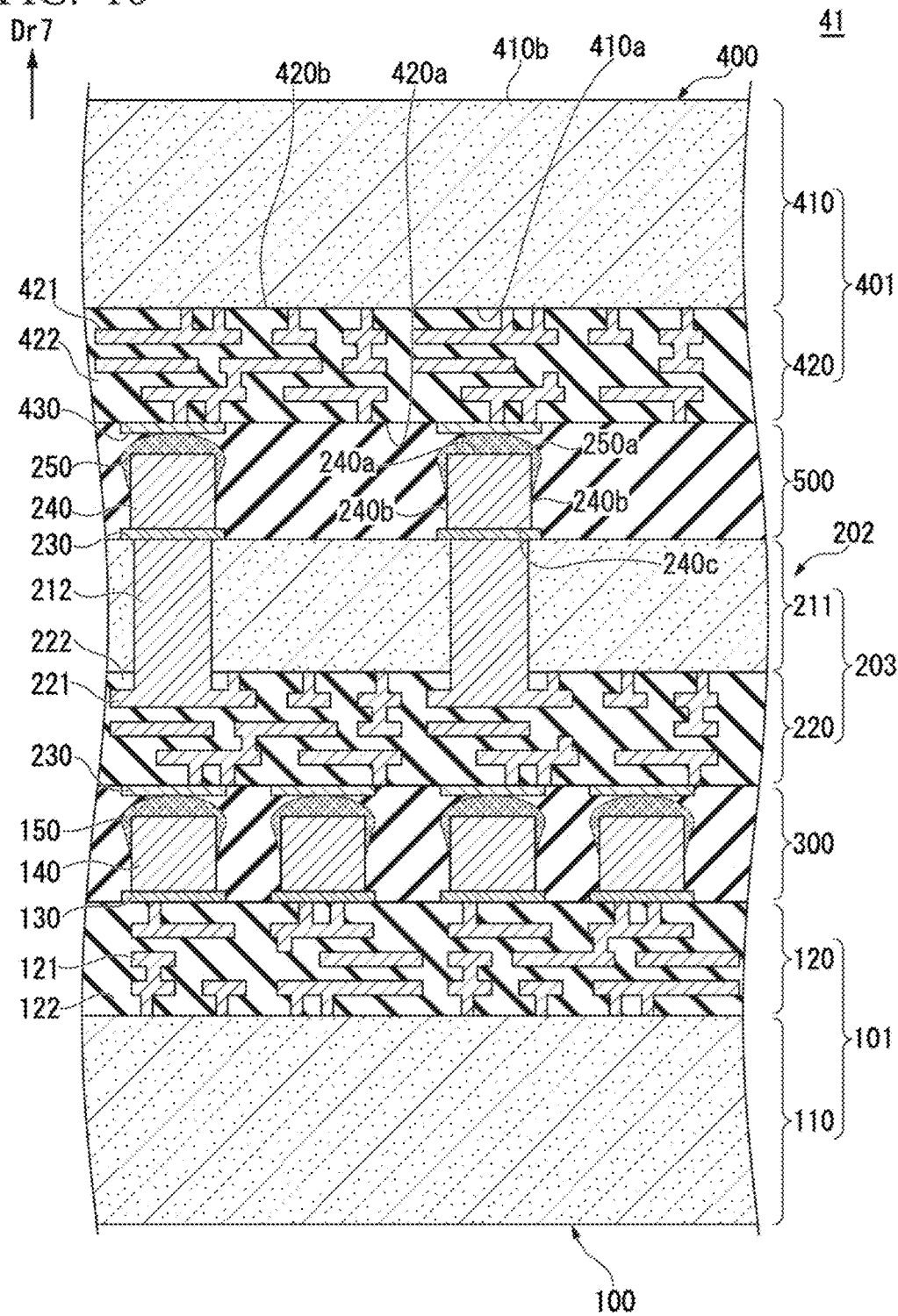
FIG. 16 is a cross-sectional view of the semiconductor device according to the third embodiment of the present invention.

FIG. 16 shows a constitution of the semiconductor device 41. In FIG. 16, a cross section of the semiconductor device 41 is shown.

The substrate 100 shown in FIG. 16 is the same as the substrate 100 shown in FIG. 1. As shown in FIG. 16, the substrate 202 has a support layer 203, an electrode 230, a first bump 240, and a second bump 250. Although a plurality of electrodes 230 are present in FIG. 16, a reference numeral of one electrode 230 is shown as a representative. Although a plurality of first bumps 240 are present in FIG. 16, a reference numeral of one first bump 240 is shown as a representative. Although a plurality of second bumps 250 are present in FIG. 16, one reference numeral of the second bump 250 is shown as a representative.

The support layer 203 includes a semiconductor layer 211 and a wiring layer 220. The semiconductor layer 211 has through-vias 212. The through-vias 212 are formed of a conductive material. For example, the conductive material constituting the through-via 212 is a metal such as aluminum (Al), copper (Cu) and so on. The through-via 212 passes through the semiconductor layer 211 and is also connected to the wiring 221. In addition, the through-via 212 is connected to the electrode 230. In the semiconductor layer 211, a portion other than the through-via 212 is formed of a semiconductor material. The wiring layer 220 shown in FIG. 16 is the same as the wiring layer 220 shown in FIG. 14.

The electrode 230 shown in FIG. 16 is the same as the electrode 130 shown in FIG. 1. A plurality of electrodes 230 may not be provided. That is, the second bump 250 may be in contact with the second surface 210b. A plurality of first bumps 240 are disposed on the plurality of electrodes 230. The plurality of first bumps 240 are in contact with the plurality of electrodes 230. That is, the plurality of first bumps 240 are connected to the plurality of electrodes 230. The first bump 240 is filled with a first conductive metal. For example, the electrode 230 and the first bump 240 are formed of the same material.

A shape of the first bump 240 is the same as a shape of the first bump 140. That is, the first bump 240 has a first upper surface 240a, a side surface 240b, and a bottom surface 240c. The first bump 240 has a column shape.

A plurality of second bumps 250 are disposed on the first upper surface 240a and the side surface 240b. The plurality of second bumps 250 are in contact with the first upper surface 240a and the side surface 240b. That is, the plurality of second bumps 250 are connected to the plurality of first bumps 240. The second bump 250 includes a plurality of fine particles formed of a second conductive metal. That is, the second bump 250 is an aggregation of the plurality of fine particles formed of the second conductive metal. The second bump 250 covers the whole of the first upper surface 240a and a part of the side surface 240b. A shape of the second bump 250 is the same as a shape of the second bump 150. That is, the second bump 250 has a convex second upper surface 250a.

The connection layer 300 shown in FIG. 16 is the same as the connection layer 300 shown in FIG. 14. As shown in FIG. 16, the substrate 400 has a support layer 401 and an electrode 430. Although a plurality of electrodes 430 are present in FIG. 16, a reference numeral of one electrode 430 is shown as a representative.

The support layer 401 includes a semiconductor layer 410 and a wiring layer 420. The semiconductor layer 410 and the wiring layer 420 are stacked in a thickness direction Dr7 of the semiconductor layer 410 and the wiring layer 420. The thickness direction Dr7 is a direction perpendicular to a first surface 420a. The semiconductor layer 410 and the wiring layer 420 are in contact with each other. The support layer 401 supports the electrode 430.

The semiconductor layer 410 is formed of a semiconductor material. The semiconductor layer 410 has a first surface 410a and a second surface 410b. The first surface 410a is in contact with the wiring layer 420. The second surface 410b constitutes one of main surfaces of the support layer 401. The main surface of the support layer 401 is the widest surface among the plurality of surfaces constituting the surface of the support layer 401.

The wiring layer 420 includes a wiring 421 and an interlayer insulation film 422. Although a plurality of wirings 421 are present in FIG. 16, a reference numeral of one wiring 421 is shown as a representative.

The wiring 421 is formed of a conductive material. The wiring layer 420 has a first surface 420a and a second surface 420b. The first surface 420a is in contact with the plurality of electrodes 430. The first surface 420a constitutes one of the main surfaces of the support layer 401. The second surface 420b is in contact with the first surface 410a.

The wiring 421 is a thin film on which a wiring pattern is formed. The wiring 421 transmits a signal. The wiring 421 of only one layer may be formed or the wiring 421 of plural layers may be formed. In an example shown in FIG. 16, a three-layer wiring 421 is formed. A multilayer wiring 421 is connected by vias.

In the wiring layer 420, a portion other than the wiring 421 is constituted by an interlayer insulation film 422. The interlayer insulation film 422 is formed of an insulating material.

At least one of the semiconductor layer 410 and the wiring layer 420 may include a circuit element such as a transistor.

The plurality of electrodes 430 are disposed on the first surface 420a. The electrode 430 is formed of a conductive material. The electrode 430 is connected to the via of the wiring layer 420. Therefore, the electrode 430 is electrically connected to the wiring 421 through the via of the wiring layer 420. The electrode 430 is connected to the second bump 250. Accordingly, the substrate 202 and the substrate 400 are electrically connected. Therefore, the semiconductor device 41 can transmit a signal between the substrate 202 and the substrate 400. The plurality of electrodes 430 may not be disposed. That is, the second bump 250 may be in contact with the first surface 420a.

The semiconductor layer 410 may be disposed at a position of the wiring layer 420, and the wiring layer 420 may be disposed at a position of the semiconductor layer 410. In this case, for example, a through-via is disposed in the semiconductor layer 410, and the electrode 430 is connected to the wiring layer 420 through the through-via. Bumps having the same structures as the first bump 140 and the second bump 150 may be disposed on the electrode 430.

The connection layer 500 is disposed between the semiconductor layer 211 and the wiring layer 420. The connection layer 500 is formed of a resin. The connection layer 500 may be formed of an insulating material other than the resin. The connection layer 500 covers surfaces of the electrode 230, the first bump 240, the second bump 250, and the electrode 430.

As described above, the semiconductor device 41 includes the plurality of substrates, that is, the substrate 100, the substrate 202, and the substrate 400. A constitution of at least one of the plurality of substrates constituting the semiconductor device 41 has only to be the same as that of the substrate 100. The semiconductor device of each embodiment of the present invention may have four or more substrates.

In the third embodiment, the semiconductor device 41 includes the first bump 140, the second bump 150, the first bump 240, and the second bump 250. Therefore, the pressure required for bonding the substrate 100 and the substrate 202 constituting the semiconductor device 41 is reduced. Similarly, the pressure required for bonding the substrate 202 and the substrate 400 constituting the semiconductor device 41 is reduced.

(Fourth Embodiment)

Figure 17:
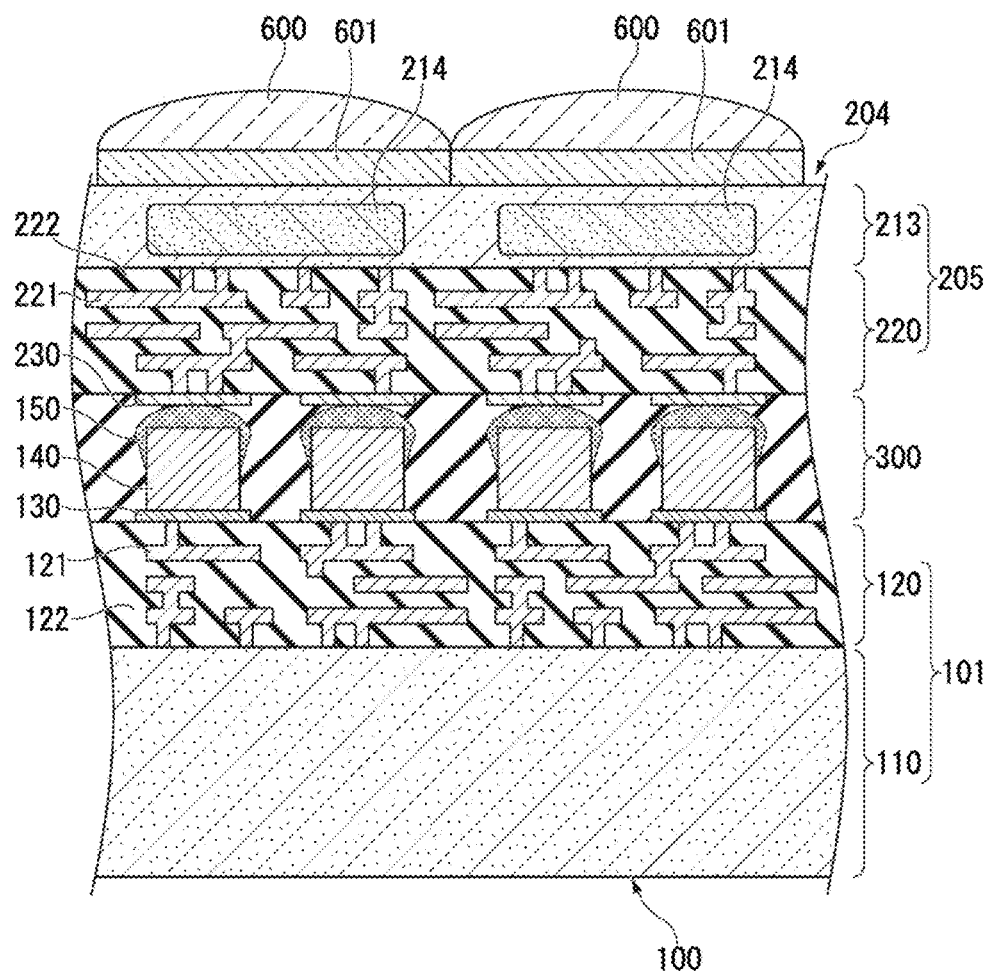
FIG. 17 is a cross-sectional view of a semiconductor device according to a fourth embodiment of the present invention.

FIG. 17 shows a constitution of a semiconductor device 42 according to a fourth embodiment of the present invention. The semiconductor device 42 is a solid-state imaging device having an imaging function. In FIG. 17, a cross section of the semiconductor device 42 is shown. As shown in FIG. 17, the semiconductor device 42 includes a substrate 100, a substrate 204, a connection layer 300, a micro-lens 600, and a color filter 601. The substrate 100 and the substrate 204 are stacked with the connection layer 300 interposed therebetween.

The substrate 100 shown in FIG. 17 is the same as the substrate 100 shown in FIG. 1. As shown in FIG. 17, the substrate 204 has a support layer 205 and an electrode 230. Although a plurality of electrodes 230 are present in FIG. 17, a reference numeral of one electrode 230 is shown as a representative.

The support layer 205 includes a semiconductor layer 213 and a wiring layer 220. The semiconductor layer 213 has a photoelectric conversion part 214. The semiconductor layer 213 is formed of a semiconductor material. For example, the photoelectric conversion part 214 is formed of a semiconductor material having an impurity concentration different from that of the semiconductor material constituting the semiconductor layer 213. The wiring layer 220 shown in FIG. 17 is the same as the wiring layer 220 shown in FIG. 14.

The electrode 230 shown in FIG. 17 is the same as the electrode 230 shown in FIG. 14. A plurality of electrodes 230 may not be provided. That is, the second bump 150 may be in contact with the first surface 220a.

The color filter 601 is disposed on a surface of the semiconductor layer 213. The micro-lens 600 is disposed on the color filter 601.

Light from an object which has passed through an imaging lens disposed optically in front of the semiconductor device 42 is incident on the micro-lens 600. The micro-lens 600 forms an image of the light transmitted through the imaging lens. The color filter 601 transmits light having a wavelength corresponding to a predetermined color.

The light transmitted through the micro-lens 600 and the color filter 601 is incident on the semiconductor layer 213. The light incident on the semiconductor layer 213 travels through the semiconductor layer 213 and is incident on the photoelectric conversion part 214. The photoelectric conversion part 214 converts the incident light into a signal.

The connection layer 300 shown in FIG. 17 is the same as the connection layer 300 shown in FIG. 14.

As described above, the semiconductor device 42 has a plurality of substrates, that is, the substrate 100 and the substrate 204. A constitution of at least one of a plurality of substrates constituting the semiconductor device 42 has only to be the same as that of the substrate 100.

In the fourth embodiment, the semiconductor device 42 includes the first bump 140 and the second bump 150. Therefore, the pressure required for bonding the substrate 100 and the substrate 204 constituting the semiconductor device 42 is reduced.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A substrate, comprising:
   a support layer having a main surface,
   a column-shaped first bump filled with a first conductive metal and also having a first upper surface and a side surface, and
   a second bump which is an aggregation of a plurality of fine particles formed of a second conductive metal and also has a third portion configured to cover the first upper surface and a fourth portion configured to cover a part of the side surface,
   wherein the first bump is disposed on the main surface, or the first bump is connected to an electrode disposed on the main surface,
   the second bump has a convex second upper surface, and a height of the fourth portion in a direction perpendicular to the first upper surface is smaller than that of the first bump.

2. The substrate according to claim 1, wherein the second bump has a first portion and a second portion,
the first portion is located on a first direction side with respect to the side surface and a first surface,
the second portion is located on a second direction side with respect to the first surface,
the first surface is a surface which is perpendicular to the first upper surface and is also connected to the side surface,
the first direction is a direction which is perpendicular to the side surface and is also away from the first bump,
the second direction is a direction which is opposite to the first direction, and
a first thickness of the first portion is smaller than a second thickness of the second portion.

3. The substrate according to claim 2, wherein a value obtained by dividing the first thickness by the second thickness is 0.01 or more and 0.5 or less.

4. The substrate according to claim 1, wherein the third portion is located on a third direction side with respect to a second surface,
the fourth portion is located on a fourth direction side with respect to the second surface,
the second surface is a plane which is in parallel with the first upper surface and is also in contact with the first upper surface,
the third direction is a direction which is directed from the support layer toward the first upper surface,
the fourth direction is a direction which is opposite to the third direction, and
a height of the third portion is less than or equal to a length of the fourth portion in the third direction on the side surface.

5. The substrate according to claim 4, wherein a value obtained by dividing the height of the third portion by the length is 0.01 or more and 0.5 or less.

6. The substrate according to claim 1, wherein an average particle diameter of the plurality of fine particles is 0.01 μm or more and 1 μm or less.

7. The substrate according to claim 1, wherein the support layer has a semiconductor layer and a wiring layer stacked on the semiconductor layer, and the semiconductor layer or the wiring layer has the main surface.

8. A semiconductor device having a plurality of substrates, in which at least one of the plurality of substrates comprises:
a support layer having a main surface,
a column-shaped first bump filled with a first conductive metal and also having a first upper surface and a side surface, and
a second bump which is an aggregation of fine particles formed of a second conductive metal and also has a third portion configured to cover the first upper surface and a fourth portion configured to cover a part of the side surface,
wherein the first bump is disposed on the main surface, or the first bump is connected to an electrode disposed on the main surface,
the second bump has a convex second upper surface,
a height of the fourth portion in a direction perpendicular to the first upper surface is smaller than that of the first bump,
the support layer has a semiconductor layer and a wiring layer stacked on the semiconductor layer, and
the semiconductor layer or the wiring layer has the main surface.

* * * * *